United States Patent
Cywar et al.

[11] Patent Number: 5,460,921
[45] Date of Patent: Oct. 24, 1995

[54] HIGH DENSITY PATTERN TEMPLATE: MATERIALS AND PROCESSES FOR THE APPLICATION OF CONDUCTIVE PASTES

[75] Inventors: Douglas A. Cywar, Danbury, Conn.; Charles R. Davis, Endicott, N.Y.; Thomas P. Duffy, Endicott, N.Y.; Frank D. Egitto, Binghamton, N.Y.; Paul J. Hart, Endicott, N.Y.; Gerald W. Jones, Johnson City, N.Y.; Edward McLeskey, Waterford, Mich.

[73] Assignee: International Business Machines Corporation, Armonk, N.Y.

[21] Appl. No.: 118,010

[22] Filed: Sep. 8, 1993

[51] Int. Cl.$^6$ ..................................... G03C 5/00
[52] U.S. Cl. .................. 430/314; 430/311; 430/313; 430/317; 430/324; 430/329; 430/30; 430/945; 216/65; 216/66; 216/20; 216/83
[58] Field of Search ..................... 430/311, 313, 430/317, 324, 329, 330, 314, 945; 156/643

[56] References Cited

U.S. PATENT DOCUMENTS

| | | |
|---|---|---|
| 3,535,137 | 10/1970 | Haller et al. . |
| 3,582,398 | 6/1971 | Ringler ......................... 117/33.3 |
| 3,601,523 | 8/1971 | Arndt . |
| 3,956,052 | 5/1976 | Koste et al. . |
| 4,061,652 | 12/1977 | Schroeter et al. ............. 260/308 |
| 4,414,059 | 11/1983 | Blum et al. . |
| 4,539,222 | 9/1985 | Anderson, Jr. et al. . |
| 4,576,870 | 3/1986 | Liebler et al. ................ 428/515 |
| 4,617,085 | 10/1986 | Cole, Jr. et al. . |
| 4,842,677 | 6/1989 | Wojnarowski et al. . |
| 4,865,873 | 9/1989 | Cole, Jr. et al. ............. 427/53.1 |
| 5,073,478 | 12/1991 | Banks et al. .................. 430/317 |
| 5,098,527 | 3/1992 | Banks et al. .................. 430/325 |
| 5,262,614 | 11/1993 | Katayama et al. .......... 219/121.69 |

OTHER PUBLICATIONS

Derwent Abstract of Research Article 257043, published Sep. 10, 1985, entitled "Excimer Laser Patterning of Green Sheet Ceramics—Giving Highly Conductive, Densely Packaged Pattern of Connecting Paths Between Chips by Ablative Decomposition of Greet Sheet Polymer".

Primary Examiner—Marion E. McCamish
Assistant Examiner—Laura Weiner
Attorney, Agent, or Firm—Calfee Halter & Griswold

[57] ABSTRACT

The present invention provides a method of ablative photodecomposition and forming metal pattern which attains high resolution, is convenient, and employs non-halogenated solvents. The present invention is directed to a process for forming a metal pattern, preferably circuitization on an organic substrate, preferably on a circuit board or component thereof, which comprises coating the substrate with an ablatively-removable coating comprising a polymer resin preferably an acrylate polymer resin and preferably an ultraviolet absorber. A pattern is formed in the polymer coating corresponding to the desired metal pattern by irradiating at least a portion of the polymer coating with a sufficient amount of ultraviolet radiation to thereby ablatively remove the irradiated portion of the polymer coating. Next the patterned substrate is coated with a conductive metal paste to define the metal pattern, and the conductive metal paste is cured. The remaining polymer coating is removed by solvent stripping with non-halogenated solvents. The present invention further includes patterning electronic structures comprising multilayer circuitry using the above method. An excimer laser is used to form vias or through holes in the electronic structure while simultaneously patterning the polymer coating. This results in perfect alignment between the pattern formed in the polymer coating and the vias or through holes. High resolution circuitry is thus attainable when the electronic structure is subsequently metallized with a conductive metal paste.

15 Claims, 2 Drawing Sheets

HIGH DENSITY PATTERN TEMPLATE: MATERIALS AND PROCESSES FOR THE APPLICATION OF CONDUCTIVE PASTES

BACKGROUND OF THE INVENTION

A method of forming metal patterns on a substrate, particularly forming the patterned circuitry on high density electronic packaging, utilizes a technique termed "ablative photodecomposition." This technique involves depositing an organic polymer coating on the substrate to be patterned. The organic coating, which is sensitive to radiation, is then patterned by irradiation from a laser, typically an excimer laser. Commercially available excimer lasers typically emit at either 193 nm, 248 nm, 308 nm or 351 nm. The lasers which emit at 193 nm and 248 nm both require fluorine gas whereas the lasers that emit at 308 nm require a chlorine containing gas. Fluorine gas is more difficult to handle and dispose of than chlorine gas. In ablative photodecomposition, a large number of photons of a particular wavelength are directed to the coating in a short time. The coating, which must be capable of absorbing at the laser wavelength, absorbs a significant portion of these photons and as a result, many polymer chain fragments are produced in a small volume in a very short amount of time. This causes a localized increase in volume which cannot be sustained, and the pressure is relieved by the process of ablation, wherein fragmented chains explode and escape from the coating, leaving an etched material. Thus, fine line patterns can be produced by this technique, without the use of wet, or solvent etching of the coating.

However, with existing ablative photodecomposition methods, one of the disadvantages is that the patterned coating is typically stripped with halogenated solvents; halogenated solvents are the subject of increased environmental regulations. In addition, existing ablative photodecomposition methods typically utilize electroless deposition of metal, typically copper, to fill the ablated pattern. Electroless plating is time and space consuming and requires solvent baths which provide a source for the evaporation of solvents.

It would be desirable to have a convenient method of ablative photodecomposition that utilizes non-halogenated stripping solvents, that does not require electroless plating and that provides high resolution of metal patterns.

SUMMARY OF THE INVENTION

The present invention provides a method of ablative photodecomposition and forming metal pattern which attains high resolution, is convenient, and employs nonhalogenated stripping solvents. In the preferred embodiment, an excimer laser that emits at about 308 nm can be used, thereby eliminating the requirement of fluorine gas. The present invention is directed to a process for forming a metal pattern on a substrate, which comprises coating the substrate with an ablatively-removable coating comprising a polymer resin, preferably an acrylate polymer resin, and preferably an ultraviolet absorber. A pattern is formed in the polymer coating corresponding to the desired metal pattern by irradiating at least a portion of the polymer coating with a sufficient amount of ultraviolet radiation from an excimer laser to thereby ablatively remove the irradiated portion of the polymer coating, and if desired, to simultaneously ablate the substrate below the polymer coating to form vias or throughholes. The patterned substrate is coated with a conductive metal paste to define the metal pattern. Then the conductive metal paste is cured and the remaining polymer coating is removed by nonhalogenated stripping solvent. The present invention further includes patterning electronic structures comprising multilayer circuitry using the above method. An excimer laser is used to form vias or through holes in the electronic structure while simultaneously patterning the polymer coating. This results in perfect alignment between the pattern formed in the polymer coating and the vias or through holes. High resolution circuitry is thus attainable when the electronic structure is subsequently metallized with a conductive metal paste.

DETAILED DESCRIPTION OF THE INVENTION

Figure 1A:
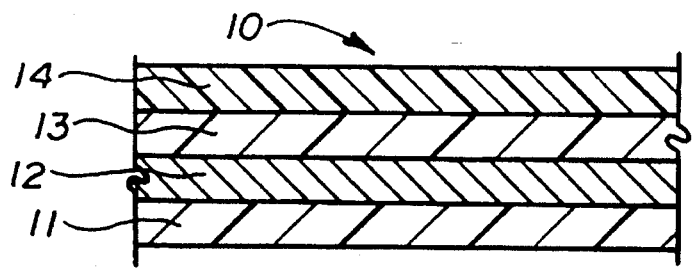
FIGS. 1A–1E schematically illustrate the process of ablative photodecomposition according to the present invention.
Figure 1B:
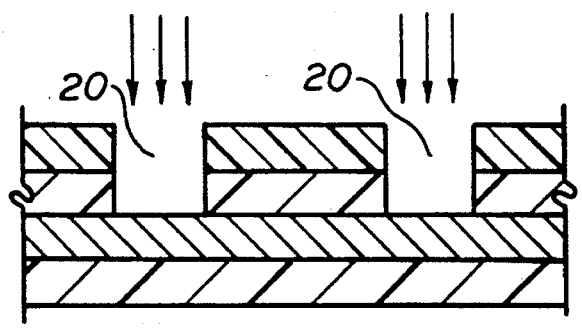
Figure 1C:
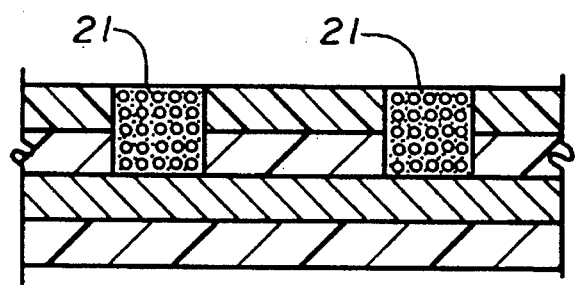
Figure 1D:
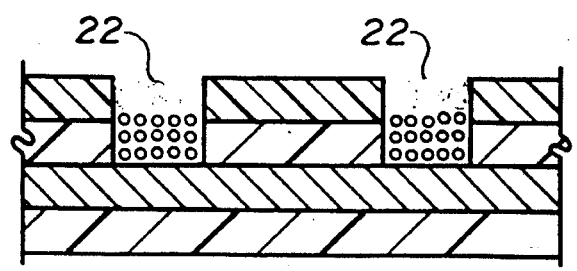
Figure 1E:
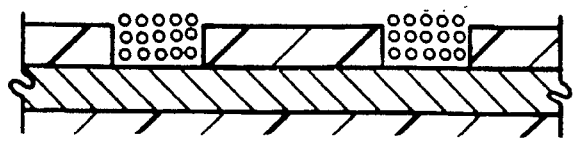

The present invention provides a method of ablative photodecomposition and forming a high resolution metal pattern which is convenient, and employs nonhalogenated stripping solvents. The resolution attainable is less than 1 micron. The present invention is directed to a process for forming a metal pattern, preferably circuitization on a dielectric organic substrate, preferably on a circuit board or component thereof, which comprises coating the substrate with an ablatively-removable coating comprising a polymer resin preferably an acrylate polymer resin and preferably an ultraviolet absorber. A pattern is formed in the polymer coating corresponding to the desired metal pattern by irradiating at least a portion of the polymer coating with a sufficient amount of ultraviolet radiation to thereby ablatively remove the irradiated portion of the polymer coating. Next the patterned substrate is coated with a conductive metal paste to define the metal pattern, and the conductive metal paste is cured. The remaining polymer coating is removed by non halogenated stripping solvents.

The present invention further includes patterning electronic structures comprising multilayer circuitry using the above method. A commercially available excimer laser is used to form vias or through holes in the electronic structure while simultaneously patterning the polymer coating. This results in perfect alignment between the pattern formed in the polymer coating and the vias or through holes. High resolution circuitry is thus attainable when the electronic structure is subsequently metallized with a conductive metal paste.

The process of the present invention will be described by reference to FIGS. 1A to 1E. Electronic structure 10 comprises dielectric layer 11, first conductive layer 12 on top of layer 11, and second dielectric layer 13 on top of conductive layer 12. Dielectric layers 11 and 13 preferably comprise an organic polymer, such as polytetrafluoroethylene typically filled with an inorganic material such as $SiO_2$. Conductive layer 12 typically comprises metals such as copper, gold, aluminum, silver, molybdenum or a mixture of metals. An ablatively removable polymeric composition is blanket coated, such as by roll coating, on top of dielectric layer 13, to provide polymeric coating 14. Preferably the polymeric coating 14 is a thickness of about 0.3 to 1.0 mils, more preferably about 0.8 mils.

Preferably, then the electronic structure 10 is heated to typically between about 70° C. and 150° C. for about 15 to about 30 minutes, to remove the bulk of solvent from the polymer coating 14. Then the electronic structure 10 is baked at a final temperature of about 200° C. to about 250° C. preferably about 230° C. for at least about 90 minutes preferably 150 minutes to cure coating 14. The result is a smooth, hard and uniform polymer coating 14 on dielectric layer 13. The polymeric composition may also be coated on dielectric layer 11 to form patterns on the outside surface of dielectric layer 11. The laser is aligned to the electronic structure by an x-y table. Alternatively the laser may be aligned through a mask.

Polymer coating 14 is then excimer laser ablated into the desired electrical pattern, utilizing a fluence of 1–20 J/cm$^2$, preferably less than 12 J/cm$^2$. Preferably the excimer laser emits a wavelength of about 308 nm; such excimer lasers have the advantage of utilizing xenon and chlorine containing gas as opposed to excimer lasers which emit at 193 and 248 nm and which require fluorine gas. The excimer laser is also used to ablate underlying dielectric layer 13 and expose conductive layer 12 at the same time polymer coating 14 is ablated, resulting in via 20 shown in FIG. 1. Through holes in electronic structure 10 can also be formed at the same time polymer coating 14 is ablated. The simultaneous ablation of polymer coating 14 and dielectric layer 13 results in perfect alignment between via 20 and the pattern formed in polymer coating 14.

After the pattern, or mask is formed in polymer coating 14, conductive metal paste 21 is then applied, for example, by screening using draw down techniques, into the defined regions including the vias and through holes. The conductive metal paste has bulk resistivity of about 50 to about 100 micro-ohms-cm, preferably about 65 micro-ohms-cm, a contact resistance of about 0.1 to about 50 micro-ohm-cm$^2$, preferably about 0.26 micro-ohm-cm$^2$, and is able to withstand temperatures of at least 350° C., preferably 380° C. Preferably the conductive metal paste 21 has the following properties: it is suitable to be applied by screening; it is easily removed from the surface of the polymer coating; it has metal particle size less than about 5 microns; and it has paste viscosity of about 20,000 to about 40,000, preferably about 30,000 cps. Suitable conductive metal pastes comprise metal powder, such as gold, silver and copper and a polymeric vehicle comprising a polymer and solvent. Conductive metal paste 21 is commercially available such as Staystik 301 from Staystik Inc., or Ablestik from Staystik Inc.

The substrate in which the conductive metal paste 21 is to be applied is preferably placed on a flat vacuum screening plate. The conductive metal paste 21 is selectively applied to the substrate, as identified by the ablated polymer composition template, by conventional techniques such as utilizing a rubber squeegee that applies a force of about 20–30 psi at a rate of about 0.5"/second. The electronic structure is then baked at from about 125° to 220° C., preferably 125° C. from 60 to about 120 minutes, preferably about 90 minutes. The bake is in a conventional oven such as in a convection oven to permit the metal paste to adhere sufficiently to the substrate and to remove the solvent vehicle from the metal paste, leaving primarily conductive metal 22 in the voids of polymer coating 14 and via 20.

Polymer coating 14 is then removed from the electronic structure with a suitable stripping solvent. Suitable stripping solvents have a high boiling point, that is greater than about 110° C., preferably greater than about 130° C. and are chosen so that they will selectively remove the polymer coating 14 without swelling any surrounding organic dielectric materials. The preferred stripping solvent is propylene carbonate. Preferably the stripping solvent is heated, preferably at about 150° C. Other suitable stripping solvents include, for example, g-butyrolactone, N-methyl pyrrolidone, ethyl lactate, propylene glycol methyl ether acetate, dimethyl formamide, diethylene glycol dimethyl ether. Preferably, the stripping solvent is non-halogenated. Although halogenated solvents such as chloroform and methylene chloride will strip the polymer composition, they are less preferred. Following the removal of polymer coating 14, the electronic structure is rinsed with water.

The ablatively removable polymeric composition

The ablatively removable polymeric composition which when applied to the substrate provides polymer coating 14, preferably possesses the following properties: chemical resistance, especially to the components comprising the conductive metal paste; toughness at the temperature of use, which is typically room temperature; good film forming characteristics, that is the polymer composition dries to a non-tacky, continuous film; suitability for screening; and thermal resistance, preferably to at least 70° C., more preferably to at least 240° C. Polymer coating 14 must be removable by the stripping solvent particularly after the conductive metal paste is baked.

The polymeric composition comprises a polymeric resin, or mixtures of polymer resins and optionally, though preferably, an ultraviolet (UV) absorber and a solvent. Where the polymeric composition is transparent at the wavelength of the excimer laser, such as PMMA at a wavelength of 308 nm, an absorber is required. Preferably, the polymeric composition comprises by total composition, 5–20% by weight polymeric resin, 80–95% by weight solvent and 0–15% by weight of UV absorber. The polymeric resin preferably comprises an acrylate polymer, such as, for example, polymethylmethacrylate, polyethylmethacrylate, polybutylmethacrylate, and mixtures or copolymers thereof. Polymethylmethacrylate is preferred, more preferred is polymethylmethacrylate (hereinafter "PMMA") having an average molecular weight of between about 25,000 to about 250,000, preferably between about 125,000 to about 175,000. PMMA is commercially available from E. I. dupont de Nemours under the trademark ELVACITE. ELVACITE 2021, 2008 and 2010 are preferred; ELVACITE 2041 is more preferred. PMMA has the advantage of being both laser and mechanically drillable.

Suitable UV absorbers are those that absorb radiation at the wavelength emitted by the excimer laser and will cause, through the transfer of energy, the ablation of the polymer coating upon exposure to UV radiation. Substituted hydroxyphenyl benzotriazoles, such as TINUVIN 328, manufactured by Ciba-Geigy Corporation, is an example of a suitable UV absorber to be used in combination with a polymer resin, such as PMMA and a excimer laser that emits at 157 to 351 nm, preferably about 308 nm. Other suitable UV absorbers include pyrene, coumarin and derivatives thereof.

When a UV absorber is included in the polymeric composition, then an organic solvent is also used. The organic solvent provides uniform dispersion of the UV absorber, and preferably the organic solvent permits uniform and easy coating of the polymer composition. Examples of suitable organic solvents include diethylene glycol dimethyl ether, ethyl lactate toluene, acetone, methyl ethyl ketone, methylene chloride, ethyl acetate, tetrahydrofuran, acetonitrile and dimethyl formamide.

The polymer resin, and when employed, the UV absorber, are dissolved in the solvent, and the polymer composition is coated onto dielectric layer 13. It is to be understood that the polymeric coating 14, when applied, contains prepolymers, oligomers, or other materials polymerizable to a polymeric coating.

EXAMPLE 1

The polymeric composition was prepared by first heating 800 g of diethylene glycol dimethyl ether to 70° C., followed by the addition of 88.9 g ELVACITE 2041 PMMA resin. After mechanically stirring for 3 hours, the solution was cooled and 4.19 g TINUVIN 328 was added. The mixture was stirred for 30 minutes, resulting in a homogeneous polymer composition comprising 89.6% solvent, 10.0% PMMA resin and 0.4% UV absorber by weight.

Figure 2:
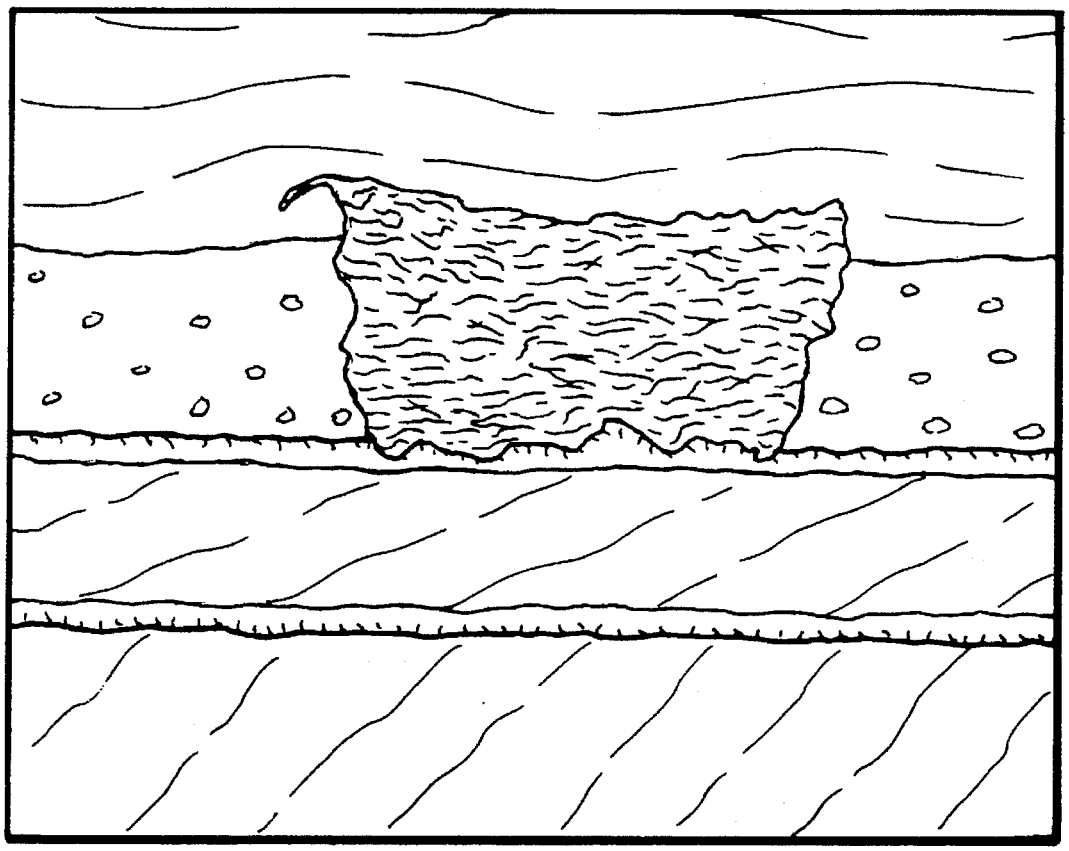
FIG. 2 is a photograph of an electronic structure showing the high resolution attainable with the present invention.

The polymer composition was roll coated onto the top dielectric layer of a substrate comprising a conductive layer of copper sandwiched between two dielectric layers of $SiO_2$ filled polytetrafluoroethylene. The substrate was then baked in a convection oven at 100° C. for 10 minutes to remove the solvent. The resulting coating was smooth and hard and had a thickness of 0.35 mil. The polymer coating and underlying dielectric layer were excimer laser ablated at a wavelength of 308 nm, with a 25 nanosecond pulse duration, into a pattern of aligned voids in the polymer coating and vias. STAYSTIK 301, a conductive metal paste containing gold powder from STAYSTIK Inc., was screened into the voids and vias using draw down techniques and baked at a final temperature of 230° C. for 150 minutes to remove the solvent from the conductive metal paste, and to coalesce the metal paste. The metal remained in the voids and vias. The polymer coating was then stripped from the dielectric layer with propylene carbonate at 70° C. in about 10 minutes. The substrate was rinsed with a stream of water at 45° C. FIG. 2 shows the structure of the resulting product.

EXAMPLE 2

The composition of Example 1 was prepared as in Example 1, except that ethyl ether was substituted for diethylene glycol dimethyl ether.

The invention is not limited to the embodiments of the electronic structure or package and the method of producing a high density template which have just been described; it is intended by the following claims to include all technically equivalent means which come within the full scope and true spirit of the invention.

We claim:

1. A process for forming a metal pattern on an organic substrate comprising:
   (a) first coating the substrate with an ablatively-removable polymer coating comprising a polymer resin;
   (b) then ablatively photodecomposing a portion of the polymer coating to form a desired pattern on the substrate;
   (c) then coating the patterned substrate with a conductive metal paste to define the metal pattern;
   (d) then baking the patterned substrate to coalesce metal in the conductive metal paste and drive out solvent in the conductive metal paste; and
   (e) then removing the remaining polymer coating with a non-halogenated stripping solvent, selected from the group consisting essentially of: diethylene glycol dimethyl ether; ethyl ether and propylene carbonate.

2. The process of claim 1 wherein the polymer resin comprises an acrylate polymer resin.

3. The process of claim 1 wherein the polymer resin comprises a polymethacrylate polymer resin.

4. The process of claim 1 wherein the polymer resin comprises a polymethylmethacrylate polymer resin.

5. The process of claim 1 wherein the ablative photodecomposition is accomplished with a laser.

6. The process of claim 1 wherein the ablative photodecomposition is accomplished with an excimer laser.

7. The process of claim 6 wherein the excimer laser emits radiation of a wavelength of about 308 nm.

8. The process of claim 1 wherein the conductive metal paste comprises metal dispersed in a thermally degradable polymer vehicle.

9. A process for forming a metal circuitization on a circuit board comprising:
   (a) coating the circuit board with an ablatively-removable polymer coating comprising: polymethylmethacrylate polymer resin; hydroxyphenyl benzotriazole; and organic solvent;
   (b) then ablatively photodecomposing a portion of the polymer coating to form a desired pattern in the substrate;
   (c) then coating the patterned circuit board with a conductive metal paste to define the circuitization;
   (d) then curing the conductive metal paste; and
   (e) then removing the remaining polymer coating with a non-halogenated stripping solvent, diethylene glycol dimethyl ether; ethyl ether and propylene carbonate.

10. The process of claim 9 wherein the ablative photodecomposition is accomplished with an excimer laser which emits at about 308 nm.

11. A process for metallizing an electronic structure, wherein the electronic structure comprises a conductive layer sandwiched between two dielectric layers, comprising:
   (a) first coating at least one dielectric layer with an ablatively-removable polymer coating comprising an polymer resin;
   (b) then ablatively photodecomposing a portion of the polymer coating to form a desired pattern in the substrate;
   (c) then coating the patterned polymer coating with a conductive metal paste to define the circuitization;
   (d) then curing the conductive metal paste; and
   (e) then removing the remaining polymer coating with a stripping solvent, wherein the polymer coating is characterized in that it can be removed with a non-halogenated solvent diethylene glycol dimethyl ether; ethyl ether and propylene carbonate.

12. The process of claim 11 wherein the polymer resin comprises a polymethacrylate polymer resin.

13. The process of claim 11 wherein the polymer resin comprises a polymethylmethacrylate polymer resin.

14. The process of claim 11 wherein the ablative photodecomposition is accomplished with an excimer laser.

15. The process of claim 14 wherein the excimer laser emits radiation of a wavelength of about 308 nm.

* * * * *